United States Patent [19]
Reele et al.

[11] Patent Number: 5,212,406
[45] Date of Patent: May 18, 1993

[54] HIGH DENSITY PACKAGING OF SOLID STATE DEVICES

[75] Inventors: Samuel Reele; Thomas R. Pian, both of Rochester, N.Y.

[73] Assignee: Eastman Kodak Company, Rochester, N.Y.

[21] Appl. No.: 817,229

[22] Filed: Jan. 6, 1992

[51] Int. Cl.[5] .................. H01L 23/48; H01L 23/02; H01L 23/16; H01L 27/02
[52] U.S. Cl. ................... 257/723; 257/734; 257/778; 257/532
[58] Field of Search .......... 357/68, 74, 75, 51, 357/40, 23.5; 257/723, 734, 778, 532

[56] References Cited

U.S. PATENT DOCUMENTS

| | | | |
|---|---|---|---|
| 4,419,530 | 12/1983 | Nath | 29/832 |
| 4,426,773 | 1/1984 | Hargis | 29/832 |
| 4,578,697 | 3/1986 | Takemae | 357/75 |
| 4,701,781 | 10/1987 | Sankhagowit | 357/70 |
| 4,742,385 | 5/1988 | Kohmoto | 357/74 |
| 4,801,561 | 1/1989 | Sankhagowit | 437/207 |
| 4,806,503 | 2/1989 | Yoshida et al. | 437/206 |
| 4,812,742 | 3/1989 | Abel et al. | 324/73 |
| 4,816,422 | 3/1989 | Yerman et al. | 437/51 |

Primary Examiner—Mark V. Prenty
Attorney, Agent, or Firm—Norman Rushefsky

[57] ABSTRACT

An assembly of multiple quantities of solid state memory modules, built upon a high density interconnect substrate, is described. Each memory module is of itself constructed from a multiple number of separate bare solid state memory die appropriate to the function. A multiplicity of the memory modules are constructed on a single substrate, and thereupon each module is separated from the single substrate. The separate memory die are mounted to the surface of the high density substrate, which provides the interconnection necessary to complete the memory function. The high density substrate also provides the capability for close attached capacitors for signal filtering, test vias for optimal module test and thermal vias as appropriate. The provision for multiple memory modules enables economical manufacturing plus capability for systems level interconnect.

11 Claims, 2 Drawing Sheets

HIGH DENSITY PACKAGING OF SOLID STATE DEVICES

1. FIELD OF THE INVENTION

This invention relates to test modules for semiconductor devices, and more particularly, to test modules of semiconductor devices in which a plurality of semiconductor chips are mounted as a module on a substrate.

2. DESCRIPTION OF THE PRIOR ART

As noted in U.S. Pat. No. 4,426,773, semiconductor electronic components may be mounted on substrates that have a plurality of electrically interconnected metal traces for burn-in testing and test at speed of the components. After testing, the substrates are separated along score lines or perforations and assembled as a package to a motherboard.

A problem with the prior art is that where the electronic components are memory devices, buffers, multiplexers, etc., these devices are often used in multiples and with other electronic components; i.e., capacitors, pull-up or pull-down resistors or protection devices, and there is a need for a further assembly step and test with such other components associated with the memory. Thus, the approach set forth in the prior art does not provide for an economical approach to the packaging of solid state memories.

SUMMARY OF THE INVENTION

The invention is directed to the packaging of solid state memory devices wherein an integrated systems approach is used in fabricating such devices so that the memory devices may be tested as a full integrated package. This and other advantages are realized by an array of electronic packaging substrates that is useable for testing, the array comprising a support for supporting a plurality of testable modules. A plurality of semiconductor chips is mounted on a front surface of the support, the chips being divided into subsets of chips, each subset being part of a different testable module and including a plural number of chips. A passive circuit element is located beneath each chip of a testable module and a plurality of test pads are located on a back surface of the support. A conductive via couples one of the test pads to leads on the front surface of the support.

In accordance with another aspect of the invention there is provided a method of manufacturing an electronic package comprising fabricating a support for supporting a plurality of testable modules, the fabricating including the steps of forming a plurality of passive circuit elements on the support and forming a plurality of test pads on a back surface of the support with a conductive via coupling one of the test pads to leads on the front surface of the support. A plurality of semiconductor chips are then mounted on a front surface of the support, the chips being divided into subsets of chips, each subset being part of a different testable module and including a plural number of chips with at least one chip in each subset being mounted over a passive circuit element. The modules are tested by applying electrical signals to the test pads. Thereafter, the substrate is separated into different modules to form electronic packages and mounted, as an electronic package having plural chips, onto a motherboard.

DESCRIPTION OF THE PREFERRED EMBODIMENTS

Figure 1:
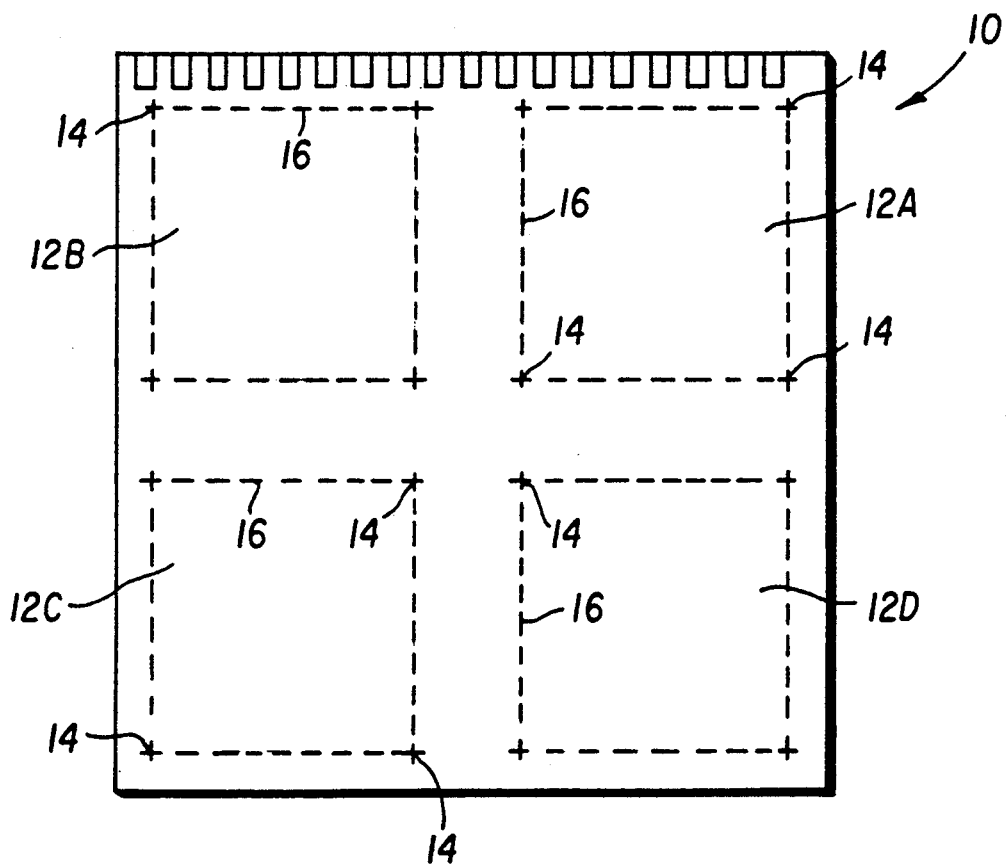
FIG. 1 is a planar view in schematic illustrating an arrangement of a plurality of memory device modules formed on high density interconnect substrates.
Figure 2:
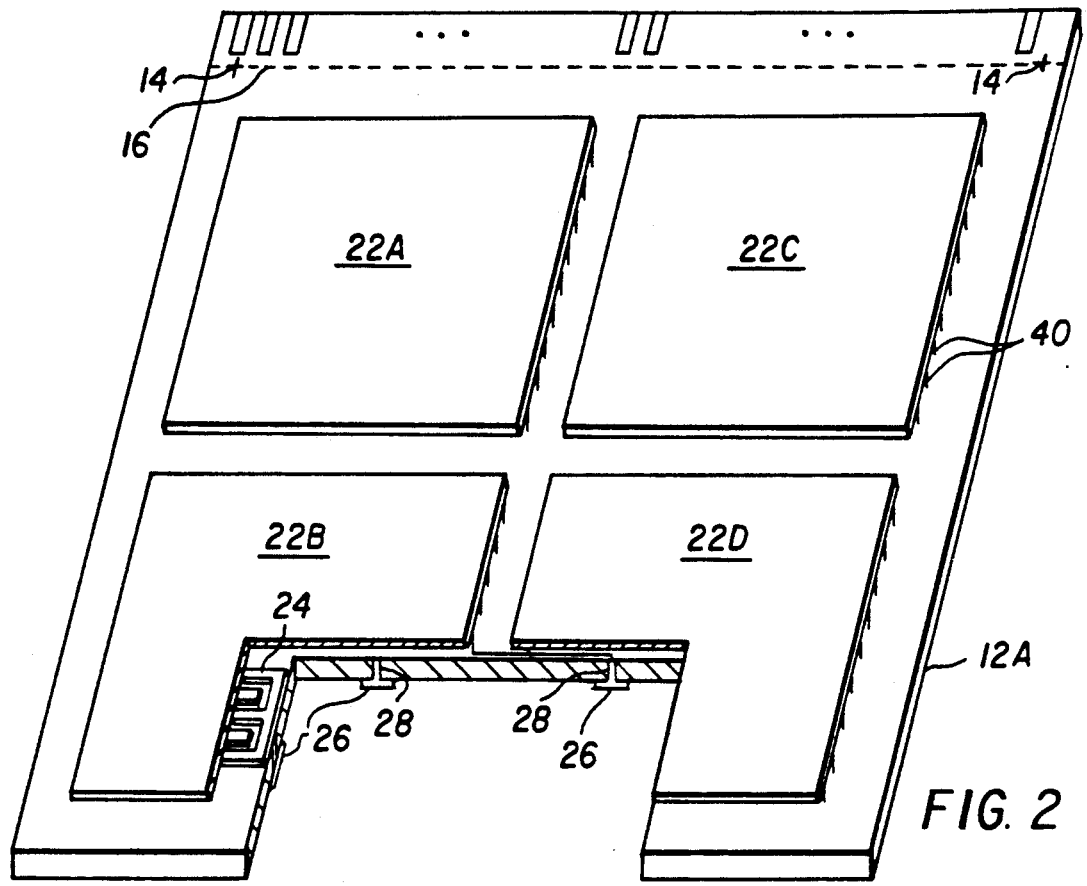
FIG. 2 is a schematic illustrating in a perspective view that is partially cut-away of a module formed on a substrate of FIG. 1.

With reference to FIGS. 1 and 2, a support or array 10 of fixed or unfixed ceramic of say beryllia, titania or titanates or alternatively high temperature-resistant polymers such as polyimide resins, glass epoxy or patterned metal/dielectric on silicon or ceramic may be used. Upon this support, conventional metallizing materials such as tungsten, molybdenum-manganese, palladium, platinum, copper, etc. may be applied to provide a metallized pattern of internal and external terminals, metallized traces and electrical contact pads on the support. This pattern may be applied by, for example, silk screening techniques, electroplating or vapor deposition.

After the metallized pattern has been applied to the array, desired portions of the array may be plated with, for example, gold using either electro or electroless plating techniques. Preferably, the plating procedure selected provides a uniform layer of gold over all areas plated therewith.

The array may contain a relatively small number of substrates, e.g., ones in which no more than four substrates are present as is illustrated in FIG. 1. Alternatively, they may contain a large number of substrates, e.g., ones in which there may be several hundred substrates present. Furthermore, it is contemplated that an array of the invention may be constructed using a single sheet on which all metallizing is deposited and then, if desired, an insulating layer of an appropriate dielectric material applied over those portions which are not to be gold plated. Still further, it is contemplated that a multilayer array according to the invention may be constructed using two or more layers of materials, for example, two or more green ceramic sheets which are adhered and fired to an integral ceramic structure. Metallized patterns may be provided on the lower layer on several of the layers, or even on all of the layers of a multilayer array. Suitable electrical connections as will be described are provided between the various layers by via holes or edge metallization as desired. Consequently, it is clear that an array of the invention may be made in many ways.

As shown in FIG. 1 an array 10 has fabricated thereon in accordance with the techniques noted above four substrates for forming in this example, four memory modules 12A-12D. Printed indicia 14 may be formed in each substrate to define corners for guiding the sawing of the substrates into separate modules after the modules have been tested. The dashed lines 16 shown in FIG. 1 represent the outlines of the four modules or can represent scoring lines facilitating fracture along said lines of the array into four separate modules. While not shown in FIG. 1 the array 10 includes suitable leads for conducting electrical signals to the components to be mounted upon the array as well as to components such as capacitors fabricated within the array. With reference now to FIG. 2 a portion of the array 10 is shown featuring in greater detail the construction of one of the modules 12A. As may be seen in FIG. 2 module 12A comprises in this example, four memory chips 22A-D that are mounted on the substrate associated with this module. In accordance with this embodiment of the invention each testable module contains a multiple number of memory devices. The quantity of memory devices may be dependent on the systems application and characteristic architecture of the particular memory types. Thus flash EEPROM type memories would have four memory chips associated with each module. SRAM type memories might have eight chips associated with each module. The memory chips are fabricated from semiconductors and are mounted on the substrate by a suitable adhesive. Connections between leads on the substrate and on each of the memory chips is accomplished by wirebonding, TAB or flip chip. The illustrated example will be discussed in terms of a flip chip connection.

Figure 3:
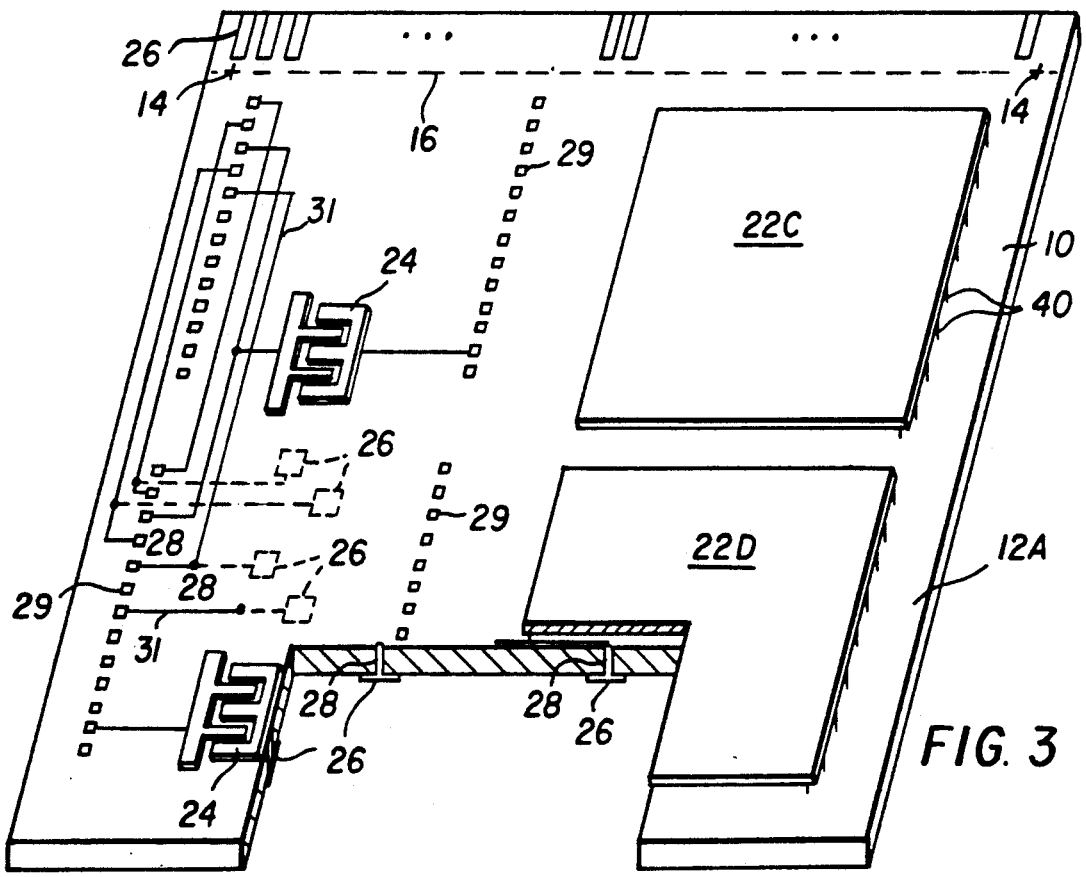
FIG. 3 is a schematic illustrating in perspective the module of FIG. 2 but with memory chips removed to better illustrate elements beneath these chips.

As may be noted in FIGS. 2 and 3, the substrate has passive circuit elements such as capacitors 24 printed on a front face thereof in locations beneath each semiconductor memory die or chip. The printed capacitors may be formed by thick film printing or thin film depositing. As shown in phantom in FIG. 3, the underside of each substrate includes a series of test pads 26. Each test pad is connected to a flip-chip substrate bond pad 29 through a respective conductive via 28 which extends from the underside of the substrate to the top side thereof. Metallized leads 31 connect the vias to respective bond pads associated with each chip. To minimize the number of test pads, metallized leads may be provided on the periphery of the substrate to route a signal from one test pad to several flip chip bond pads each associated with a different chip. As may be seen in FIG. 2, each flip-chip to be mounted on the substrate has a two-series of flip chip bond pads arranged so that a chip when mounted thereon will engage respective terminal bumps 40 formed on the chip to make electrical connections between the circuitry on the chip and that formed on the substrate. Alternatively, the metallized bumps may be formed on the substrate.

The chips are mounted on the surface and held in place by a suitable adhesive. In the course of burn-in testing or test at speed, electrical signals are provided by suitable pins which contact the test pads of the assembly while the assembly is held in a suitable fixture. The provision of separate test pads on the underside of the substrate beneath each chip allows for analysis of which chips are defective. Assuming the defective chips have been removed and the assembly repaired or the chips successfully pass the burn-in or test at speed test phase, the assembly is severed along the saw lines that are formed surrounding groups of, say, four chips as shown so that packages of four chips are provided for mounting on a motherboard.

As will be appreciated by those skilled in the art, the present invention addresses the issues leading to improving systems level considerations, yield and manufacturability, and configuration of packaged memory modules. It provides for efficient use of high density interconnect by enabling a particular area of substrate to serve simultaneously as an intermediate fabrication template, a test/burn-in platform, a test at speed socket/fixture in which passive devices are located near memory components under test, and as a final assembly substrate for incorporation into final product. Not only can hardware package density be optimized, the design and configuration considerations for assembly, test, burn-in, test at speed and final product are achieved in one substrate/process.

The present invention provides true systems level test at speed without the requirement for expensive auxiliary test fixturing. Indeed the test fixturing in the present invention realistically emulates the interconnect required for test evaluation in the final product. For example byte-wide systems tests can be achieved with the appropriate number and interconnect of multiple memory die within a single module. With the results of such high quality test, optimal decisions can be made regarding the test results, assembly/parametric test/burn-in/test at speed processes, component quality, and ultimate release of memory module subassembly to final product. Thus flexibility in the transition between subassembly to final product is enabled.

The ultimate packaging density is achieved when peripheral passive devices (capacitors, pull-up or pull-down devices, for example) are incorporated into the substrate. Passive devices have large area requirements which typically do not decrease with the advance in microelectronics technology. Another aspect of increasing memory density is to bring test/thermal management structures under each device. This is achieved by the incorporation of test and thermal vias in the present invention located under the memory die without impact on the real estate packaging density of the memory module. Interconnect to the opposite side of the module, should double sided packaging be warranted is also possible.

Although the invention has been described with relation to various specific and preferred embodiments, it is not intended to be limited thereto. Those skilled in the art will recognize that variations and modifications may be made which are within the spirit of the invention and the scope of the appended claims.

We claim:

1. An array of electronic packaging substrates that is useable for testing, the array comprising:
   a support means for supporting a plurality of testable modules;
   a plurality of semiconductor chips mounted on a front surface of said support means, said chips being divided into subsets of chips, each subset being part of a different testable module and including a plural number of chips;
   a passive circuit element located beneath a chip of each testable module;
   a plurality of test pads located on a back surface of said support means; and
   a conductive via coupling one of said test pads to leads on the front surface of said support means.

2. The array of claim 1 and wherein the passive circuit element is a capacitor.

3. The array of claim 1 and wherein the chips are memory chips.

4. The array of claim 3 and wherein the memory chips are mounted to the front surface of said support means in a flip-chip arrangement.

5. The array of claim 3 and wherein the passive circuit element is a capacitor.

6. The array of claim 1 and wherein each testable module comprises four flash EEPROM type memory chips.

7. The array of claim 1 and wherein each testable module comprises eight SRAM type memory chips.

8. The array of claim 1 and wherein each testable module is surrounded by scoring lines.

9. The array of claim 3 and wherein the test pads are beneath at least one memory chip of each module.

10. The array of claim 8 and wherein the chips are memory chips.

11. The array of claim 10 and wherein each testable module comprises four flash EEPROM type memory chips.

* * * * *